US012791638B2

(12) United States Patent
Stuerner

(10) Patent No.: US 12,791,638 B2
(45) Date of Patent: Nov. 10, 2026

(54) SENSOR UNIT FOR DETECTING A MAGNETIC FIELD

(71) Applicant: Robert Bosch GmbH, Stuttgart (DE)

(72) Inventor: Felix Michael Stuerner, Ulm (DE)

(73) Assignee: Robert Bosch GmbH, Stuttgart (DE)

( * ) Notice: Subject to any disclaimer, the term of this patent is extended or adjusted under 35 U.S.C. 154(b) by 73 days.

(21) Appl. No.: 18/552,313

(22) PCT Filed: Mar. 25, 2022

(86) PCT No.: PCT/EP2022/057873

§ 371 (c)(1),
(2) Date: Sep. 25, 2023

(87) PCT Pub. No.: WO2022/207476

PCT Pub. Date: Oct. 6, 2022

(65) Prior Publication Data

US 2024/0168112 A1 May 23, 2024

(30) Foreign Application Priority Data

Mar. 29, 2021 (DE) ..................... 10 2021 203 128.5

(51) Int. Cl.
*G01R 33/26* (2006.01)
*G01R 33/00* (2006.01)
(Continued)

(52) U.S. Cl.
CPC ......... *G01R 33/26* (2013.01); *G01R 33/0005* (2013.01); *G01R 33/0017* (2013.01); *G01R 33/032* (2013.01); *G01R 33/0354* (2013.01)

(58) Field of Classification Search
CPC ........ G02B 6/32; G02B 6/4202; G01R 33/26; G01R 33/0005; G01R 33/0017; G01R 33/032; G01R 33/0354
See application file for complete search history.

(56) References Cited

U.S. PATENT DOCUMENTS 5,122,744 A 6/1992 Koch
2005/0234329 A1 10/2005 Kraus et al.
(Continued)

FOREIGN PATENT DOCUMENTS

CN 105022005 A 11/2015
CN 110325869 A 10/2019
(Continued)

OTHER PUBLICATIONS

International Search Report corresponding to PCT Application No. PCT/EP2022/057873, mailed Jul. 7, 2022 (German and English language document) (6 pages).

*Primary Examiner* — Lee E Rodak
*Assistant Examiner* — Taqi R Nasir
(74) *Attorney, Agent, or Firm* — Maginot, Moore & Beck LLP

(57) ABSTRACT

A sensor unit for detecting a magnetic field is disclosed. The sensor unit includes (i) a light source for generating excitation light, (ii) at least one first sensor for determining a measurement signal of an object, and (iii) a second sensor for determining a background magnetic field. The first sensor is designed as a diamond-based NV magnetometer and includes a highly sensitive diamond having at least one negatively charged NV center that has a fluorescent effect and thus emits fluorescence.

7 Claims, 6 Drawing Sheets

(51) Int. Cl.
*G01R 33/032* (2006.01)
*G01R 33/035* (2006.01)

(56) References Cited

U.S. PATENT DOCUMENTS

| | | | | |
|---|---|---|---|---|
| 2007/0120563 | A1* | 5/2007 | Kawabata .......... | G01R 33/0354 324/244.1 |
| 2011/0062957 | A1* | 3/2011 | Fu ........................ | G01N 24/088 324/307 |
| 2014/0376905 | A1* | 12/2014 | Fludger ................ | H04B 10/073 398/13 |
| 2017/0370979 | A1 | 12/2017 | Braje et al. | |
| 2020/0334559 | A1* | 10/2020 | Anderson .............. | G06N 20/00 |

FOREIGN PATENT DOCUMENTS

| | | |
|---|---|---|
| DE | 10 2014 219 550 A1 | 3/2016 |
| DE | 10 2019 212 587 A1 | 2/2021 |

* cited by examiner

SENSOR UNIT FOR DETECTING A MAGNETIC FIELD

This application is a 35 U.S.C. § 371 National Stage Application of PCT/EP2022/057873, filed on Mar. 25, 2022, which claims the benefit of priority to Serial No. DE 10 2021 203 128.5, filed on Mar. 29, 2021 in Germany, the disclosures of which are incorporated herein by reference in their entirety.

The disclosure relates to a sensor unit for detecting a magnetic field and a method for detecting a magnetic field carried out with such a sensor unit.

BACKGOUND

A magnetic field is a vector field that describes the magnetic influence of electrical charges in relative movements and magnetized materials. Magnetic fields can be caused, for example, by magnetic materials, electrical currents, and temporal changes of an electrical field.

A magnetic field can be described with different quantities. Thus, the magnetic flux density, also referred to as magnetic induction, is a physical variable of the electrodynamics that describes the surface density of the magnetic flux passing perpendicularly through a particular surface element. The magnetic flux density is a directed variable, i.e., a vector.

The magnetic field strength H is another variable that describes the magnetic field. This is related to the magnetic flux density B via the relationship:

$$B=\mu*H,$$

wherein μ is the magnetic permeability.

To detect a magnetic field, it is necessary to record a variable that describes that magnetic field. Thus, for example, a measuring device can be used to detect a variable of the magnetic field, such as the magnetic flux density or the magnetic field strength, and to allocate a value to the detected variable. Such a measuring device is referred to as a magnetometer, for example.

A magnetometer is a sensory device for measuring magnetic flux densities. Magnetic flux densities are measured in the Tesla (T) unit. Common magnetometers include, for example, Hall probes, Förster probes, proton magnetometers, Kerr magnetometers, and Faraday magnetometers.

In addition to the magnetometers mentioned, the use of diamonds is also known, in which lattice defects or faults are provided that show a detectable behavior as a function of an applied magnetic field. Thus, it is known to use a negatively charged nitrogen vacancy center (NV center) in a diamond for highly sensitive measurements of magnetic fields, electrical fields, mechanical stresses, and temperatures. In this context, reference is made to FIG. 1.

Publication DE 10 2014 219 550 A1 describes a combination sensor for measuring a magnetic field comprising a sensitive component with diamond structures that has nitrogen defects. The sensitive component can be excited with radiation in the visible area.

The quantum technologies used in such arrangements have decisive advantages over classical sensor principles that underscore the disruptive potential of quantum technology. In the case of nitrogen defects, there are specifically the following advantages:

ultra-high sensitivities (1 pT/√Hz), vector magnetometry, i.e., a determination of the direction of the magnetic field, high measurement range (>1 Tesla), linearity (Zeeman effect), no degradation, since the measurement is based on quantum mechanical states, similar to the hydrogen atom, in which the Rydberg constant is a fixed energy, which is a constant independent of location and time, it is possible to determine external magnetic fields vectorally based on the four possible spatial directions of the NV axis present in the diamond.

In order to read out a sensor based on NV centers, the magnetic resonance of the triplet of the ground state is optically detected, see $^3$A state in FIG. 1 (ODMR—optically detected magnetic resonance). To do this, the NV center must be excited with green light. Reference is made to FIG. 2 in this regard. The red-shifted fluorescent light, see FIG. 2, shows a characteristic dip in the energetic position of the electron spin resonance upon additional irradiation of an alternating electromagnetic field (microwave); see FIG. 3. The position is linearly dependent on the magnetic field; see FIG. 3, due to the Zeeman effect; see FIG. 4. This allows a highly sensitive magnetic field sensor to be constructed.

SUMMARY

The disclosure relates to a sensor unit for sensing a magnetic field, wherein the sensor unit comprises a light source for generating light, namely excitation light. Furthermore, the sensor unit comprises at least a first sensor for determining a measurement signal of an object and a second sensor for determining a background magnetic field. The first sensor is designed as a diamond-based NV magnetometer and has a highly sensitive diamond having at least one negatively charged NV center, wherein the NV center has a fluorescent effect and thus emits fluorescence.

A fluorescent effect means that the NV center emits fluorescence on excitation, particularly by means of the light of the light source. Fluorescence is the spontaneous emission of light shortly after excitation of a material by electron transfer. Thus, the emitted light is regularly lower in energy than the previously absorbed light (red shift). The light emitted by fluorescence is therefore typically lower in energy than the light used for excitation, preferably by excitation light of the light source.

The diamond preferably has several NV centers, advantageously the diamond is doped with 0.01 to 10 ppm, most preferably with 0.1 to 1 ppm, NV centers. The diamond has in particular a high dynamic measuring range in configuration of up to 1 Tesla.

In particular, the light source emits light referred to as excitation light, which is primarily green light, especially light having a wavelength of about 510 nm to 540 nm, while the emitted fluorescence has a wavelength of between 650 nm and 800 nm.

The first sensor is in particular configured to be arranged in close proximity to an object to be measured. The second sensor serves in particular to determine background magnetic fields, in other words background noise, in high resolution at the location of the first sensor, while the first sensor serves to measure the actual measurement signal as small a distance as possible from the object.

The object can in particular be a human head. Here the first sensor is configured to detect the magnetic fields on the human head caused by brain activity and the associated currents. The first sensor, in that it is configured as an NV magnetometer, also provides the required sensitivity for the corresponding measurement. Further advantages of the NV magnetometer are a high dynamic range and a vectorial detection of the magnetic field, as it can be brought close to the surface of an object to be examined, for example a human brain.

Particularly preferably, the sensor unit comprises a plurality of NV magnetometers, which can be placed at different locations in the immediate vicinity of an object to be measured in order to obtain location-resolved information about the measurement signal, in particular about the field distribution of the measured magnetic field. Again, in such a case, determining the background noise using the second sensor is essential.

The second sensor is in particular a gas vapor cell magnetometer or a SQUID (Superconducting Quantum Interference Device) magnetometer.

The aforementioned magnetometers have an extraordinary magnetic sensitivity, which is in particular in the range of Femtotesla and smaller. In this regard, the second sensor is superior to the first sensor, which represents an NV magnetometer. However, gas vapor cell magnetometers and SQUIDs have the disadvantage that certain limitations apply to the distance between the sensor and the object, as well as that the spatial resolution capability only extends in the range of millimeters to centimeters. However, these are precisely the strengths of NV magnetometers and thus the first sensor, whose spatial resolution preferably extends into the nanometer range.

In order to be able to trigger particularly small magnetic fields, the influence of interference or background fields plays a particularly important role. In this respect, this is a problem with a large distance between the object and the magnetic field sensor, because the field amplitude of the field to be measured decreases sharply with the distance, namely it scales to $1/r^3$, wherein r represents the distance. If a SQUID or gas vapor cell magnetometer is now used as a sensor for measuring the actual measurement signal, magnetic shields are required in the prior art, which are very costly and also require a certain ball volume, which makes miniaturization of the entire system more difficult. With the present combination of the first sensor used to measure the actual measurement signal and the second sensor used to determine the background magnetic field, the advantages of the types of sensors used are optimally combined with each other. While the first sensor is a highly sensitive magnetic field sensor without an expensive shielding device, it may be placed in close proximity to the object, while the second sensor, which is preferably at a defined distance from the object to be measured, may perform a reference measurement to determine the background magnetic field and thus be able to subtract it from the measurement signal of the first sensor.

In particular, the sensor unit comprises an optical fiber connected to the light source, wherein the optical fiber is configured to excite the at least one NV center of the first sensor by means of the light of the light source. In other words, the fiber is connected to the light source, for example via a fiber coupler, and serves to direct the light of the light source on the diamonds and thus the at least one NV center.

The second sensor may be attached to the optical fiber such that a defined distance of the second sensor from the first sensor is obtained. The optical fiber used for the first sensor can thus be used to secure the second sensor so that the defined distance between the two sensors can be determined and also maintained during the measurement operation.

Furthermore, the sensor unit comprises an evaluation unit comprising at least one signal processing unit and control unit for determining a first measurement signal based on the first sensor and a second measurement signal based on the second sensor. The signal processing and control unit is configured to determine a background magnetic field at the location of the first sensor based on the second measurement signal of the second sensor. The known distance between the sensors is taken into account. The measurement signal of the first sensor can now be calibrated or corrected by subtracting the determined background magnetic field.

Overall extremely small magnetic fields can thus be determined without interference from a background magnetic field.

In particular, the sensor unit comprises a photodetector for receiving the emitted fluorescence. Preferably, the sensor unit comprises a lens for separating the excitation light and the emitted fluorescence, so that only the emitted fluorescence strikes the photodetector. In particular, the fluorescence emitted by the at least one NV center is read via the same optical fiber as the excitation. Therefore, separation of the excitation light and the fluorescence is essential. For this purpose, in particular a dichroic mirror is used, which can be placed in the periphery of the sensor unit, just like the second sensor.

In a further aspect, the disclosure relates to a method for sensing a magnetic field with a sensor unit described above comprising a first sensor and a second sensor. In particular, the method comprises arranging the first sensor in close proximity to an object to be measured, measuring a background field using the second sensor, determining the background magnetic field at the location of the first sensor, and calibrating a measurement signal of the first sensor using the determined background magnetic field at the location of the first sensor.

In particular, the sensor unit comprises a microwave source for generating microwaves, preferably microwaves having a frequency of around 2.87 GHz. The microwaves are necessary for the spin manipulation of the at least one NV center. In other words, using the microwaves, spin transitions are induced so that at least one NV center emits fluorescence when the microwave frequency corresponds to the transition energy of the NV center. The present disclosure exploits the Zeeman effect, namely the splitting of spectral lines by a magnetic field. The splitting occurs due to the different displacement of energy levels of individual states under the influence of the magnetic field to be measured.

Overall, the sensor unit is thus a sensor system that preferably combines two different types of sensors with one another. In other words, the present disclosure exemplifies a hybrid magnetometer approach that combines the advantages of different sensor types with one another. Thus, the following advantages are achieved with the present disclosure:

- The advantages of different types of sensors are combined, namely the exact location resolution of the first sensor with the particular sensitivity of the second sensor.
- An elaborate and expensive shielding device for the second sensor is not necessary.
- A miniaturization potential of the combined sensor system results because both the first sensor and the second sensor can be compactly constructed.
- Electrical interference fields, for example for current closures, could be accommodated in the periphery and would therefore not generate an additional background field in the area of the object to be investigated.

BRIEF DESCRIPTION OF THE DRAWINGS

The figure shows a purely schematic representation.

DETAILED DESCRIPTION

Figure 1:
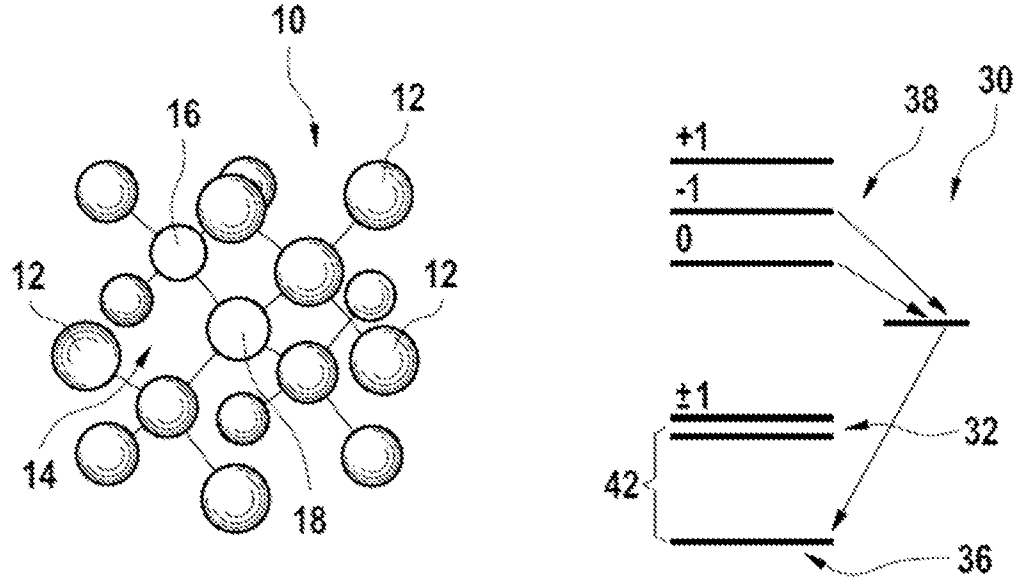
FIG. 1: nitrogen defects (NV centers) in a diamond.

FIG. 1 shows a crystal lattice on the left side, in this case a diamond, wherein the crystal lattice as a whole is designated with reference numeral 10. The crystal lattice 10 comprises a number of carbon atoms 12 and an NV center 14, which in turn comprises a nitrogen atom 16 and a defect or vacancy 18. The nitrogen defect 18 is aligned along one of the four possible binding directions in the diamond crystal.

On the right-hand side, the energy level scheme 30 of the negatively charged NV center 14 is shown. A ground state $^3A_2$ 32 is a spin-triplet with a total spin s=1. The states 34 with magnetic spin quantum number $m_S=+-1$ are energetically shifted from state 36 with $m_S=0$. A state $^3E$ 38 and an intermediate state 40 are further shown. Bracket 42 illustrates a microwave frequency of 2.87 GHz, which corresponds to a splitting energy or zero field splitting $D_{gs}$. The zero field splitting is an intrinsic variable that is independent of the radiated MW field or frequency. It is about 2.87 GHz, and in particular is temperature dependent. The following relationship applies to determining the resonance frequency:

$$v \pm D_{gs} + \beta * \Delta T \pm y_{NV} * B_0;$$

wherein ○T is the deviation from room temperature, β is the temperature shift of the zero-field splitting with β at about −74.2 kilohertz/kelvin, $y_{NV}$ is the gyromagnetic ratio of the NV center, and $B_0$ is the field strength of an external magnetic field.

Figure 2:
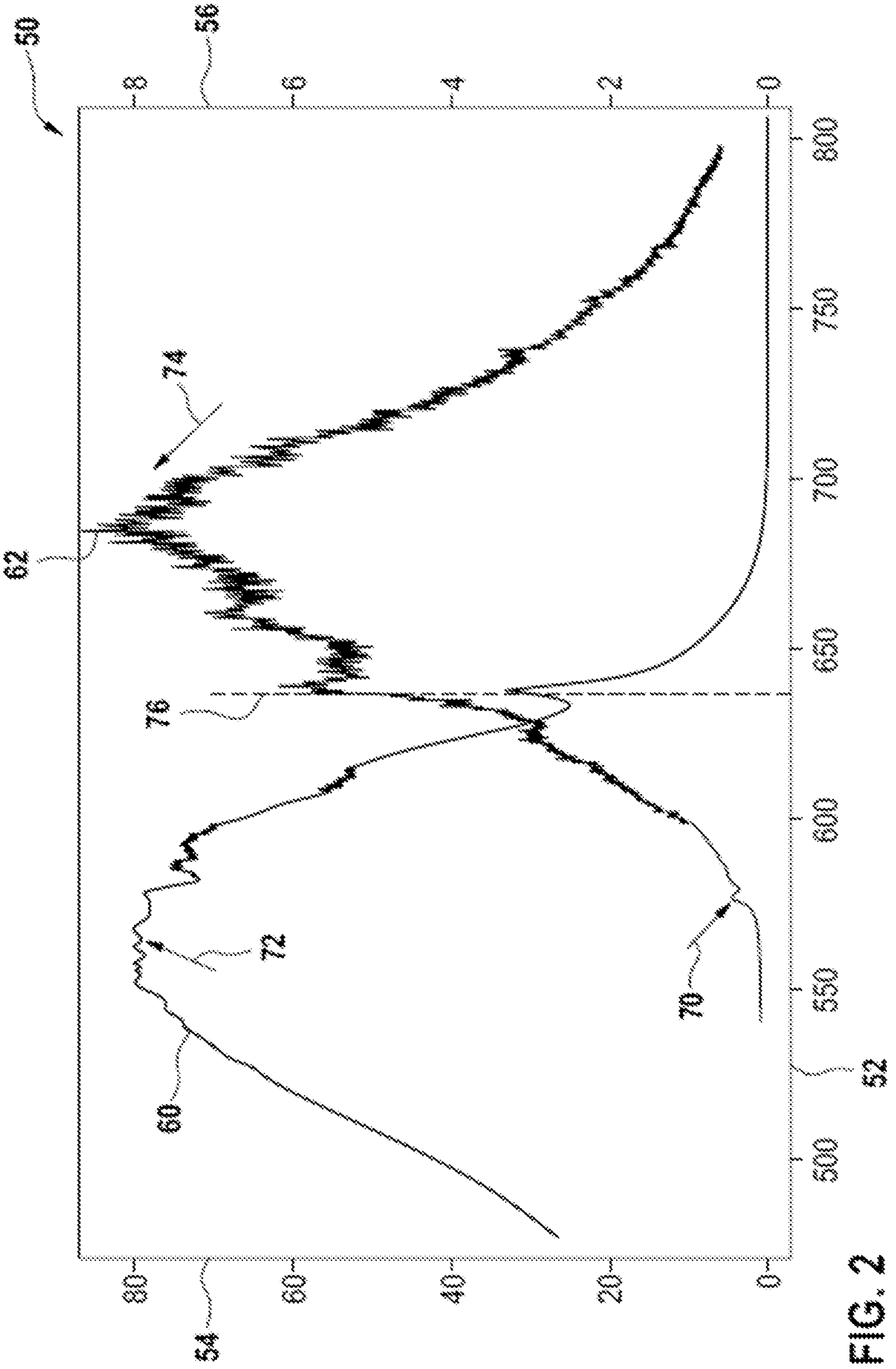
FIG. 2: an absorption and emission spectrum of the NV center.

FIG. 2 shows in a graph 50 the absorption and emission spectrum of the NV center shown in FIG. 1. In graph 50, the wavelength [nm] is plotted at an abscissa 52 and the absorption coefficient [$cm^{-1}$] is plotted at a first abscissa 54 and the fluorescence is plotted at a second abscissa 56. A first curve 60 shows the absorbent spectrum, a second curve 62 shows the emission spectrum. A first arrow 70 denotes $NV^0$ ZPL, a second arrow 72 denotes NV absorption, a third arrow 74 denotes NV fluorescence. Furthermore, NV-ZPL 76 is registered at 637 nm.

Figure 3:
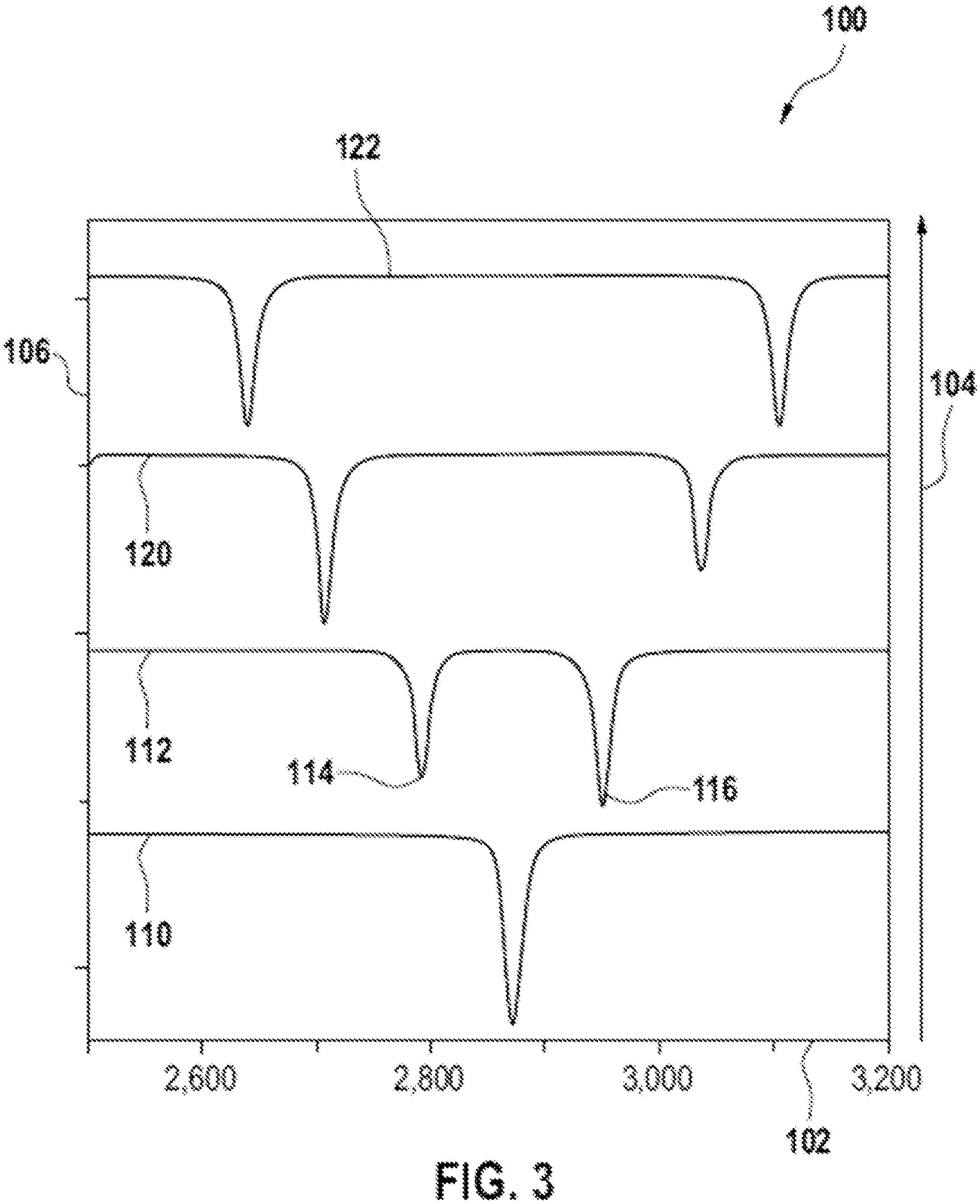
FIG. 3: an optically detected magnetic resonance of a single NV center.

FIG. 3 shows in a graph 100 the optically detectable magnetic resonance (ODMR) of a single NV center for different background magnetic fields. In the graph 100, the microwave frequency is plotted on an abscissa 102, the magnetic field B is plotted on a first ordinate 104, and the fluorescence is plotted on a second ordinate 106.

A first curve 110 shows the resonance for B=0, a second curve 112 shows the resonance at B=2.8 mT with the negative peaks $\omega_1$ 114 and $\omega_2$ 116, a third curve 120 shows the resonance for B=5.8 mT, and a fourth curve 122 shows the resonance for 8.3 mT.

Figure 4:
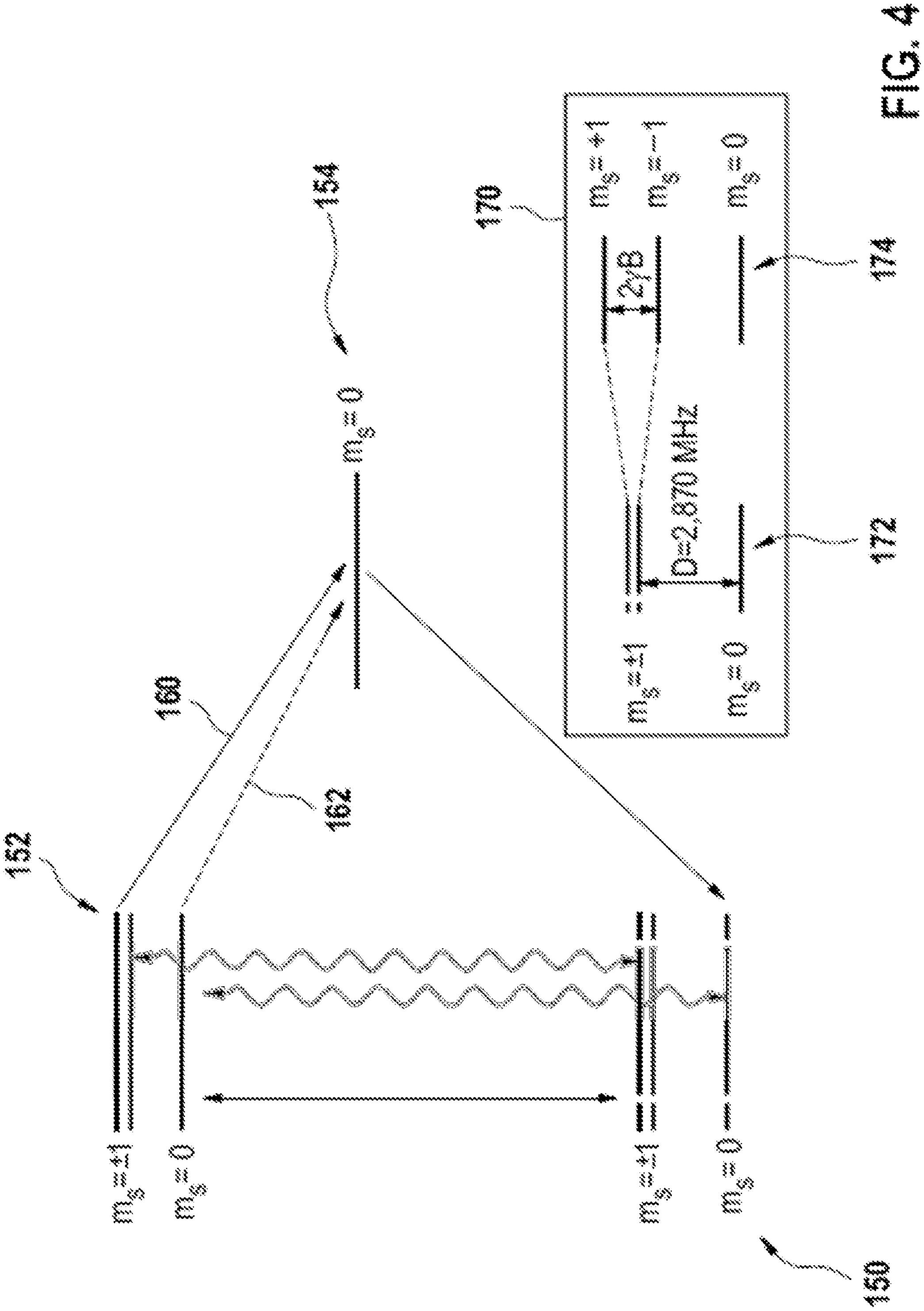
FIG. 4: the Zeeman effect within the energy diagram of the negatively charged NV center.

FIG. 4 shows the Zeeman effect in the ground state 150 of the NV center. Furthermore, the excited state 152 and the intermediate state 154 are registered. A first arrow 160 shows a transition with a high probability or transition rate, a dashed arrow 162 shows a transition with low probability or transition rate. In a box 170, a transition 172 without a magnetic field and a transition 174 with a magnetic field are shown.

Figure 5:
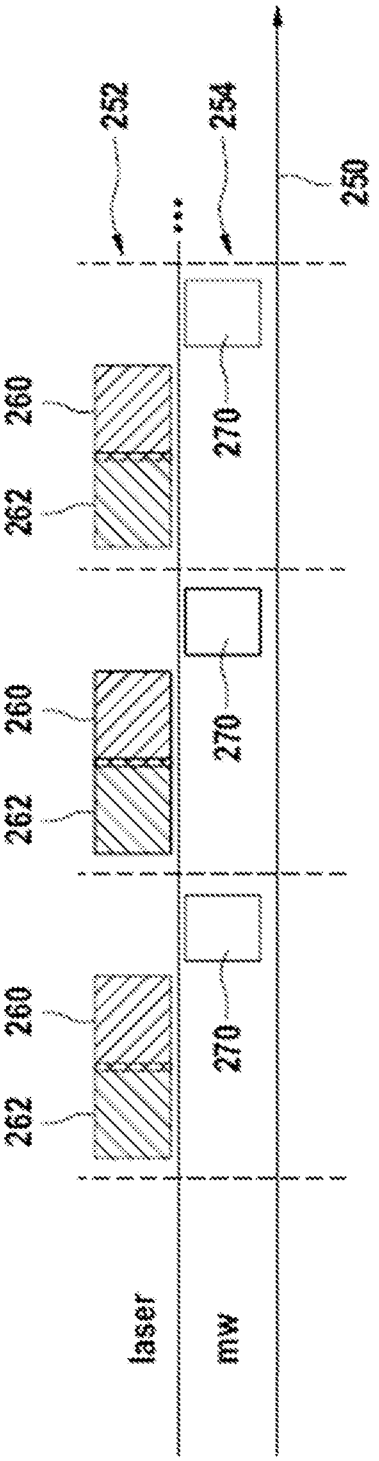
FIG. 5: pulsed excitation.

FIG. 5 shows the pulsed excitation based on its temporal progression plotted at a time axis 250. Here, the laser excitation is shown at the top 252 and the microwave excitation at the bottom 254. Note that the sequence of a laser pulse and a microwave pulse are repeated periodically. The laser pulse is used to initialize the electron spin of the NV defects (second portion of the pulse 260) and to read the electron spin after manipulation (first portion of the laser pulse 262). The microwave pulse 270 is used to manipulate the electron spin, as a function of the magnetic field, on which the measurement principle is based.

Figure 6:
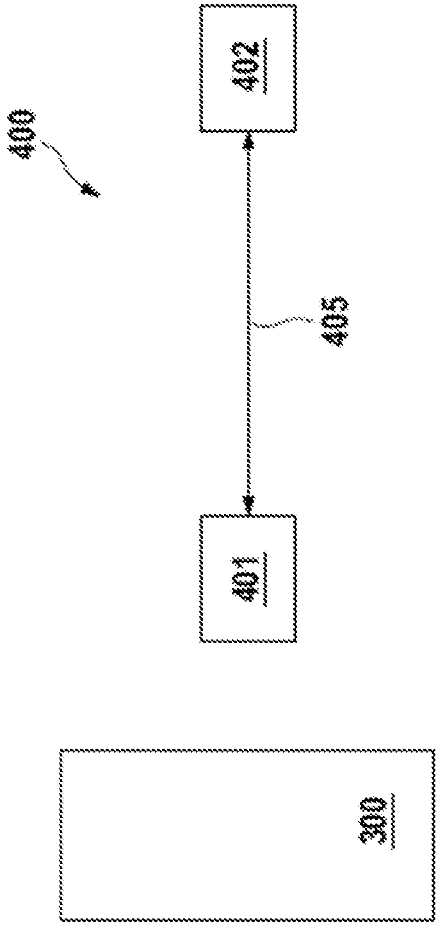
FIG. 6: the construction of a sensor unit according to the disclosure with respect to an object.

FIG. 6 shows a schematic illustration of a sensor unit 400 comprising a first sensor 401 and a second sensor 402. While the first sensor 401 is configured as a diamond-based NV magnetometer, the second sensor 402 is a gas vapor cell magnetometer or a SQUID magnetometer. There is a defined distance 405 between the two. The first sensor 401 may be brought in close proximity to an object 300 to be examined.

Figure 7:
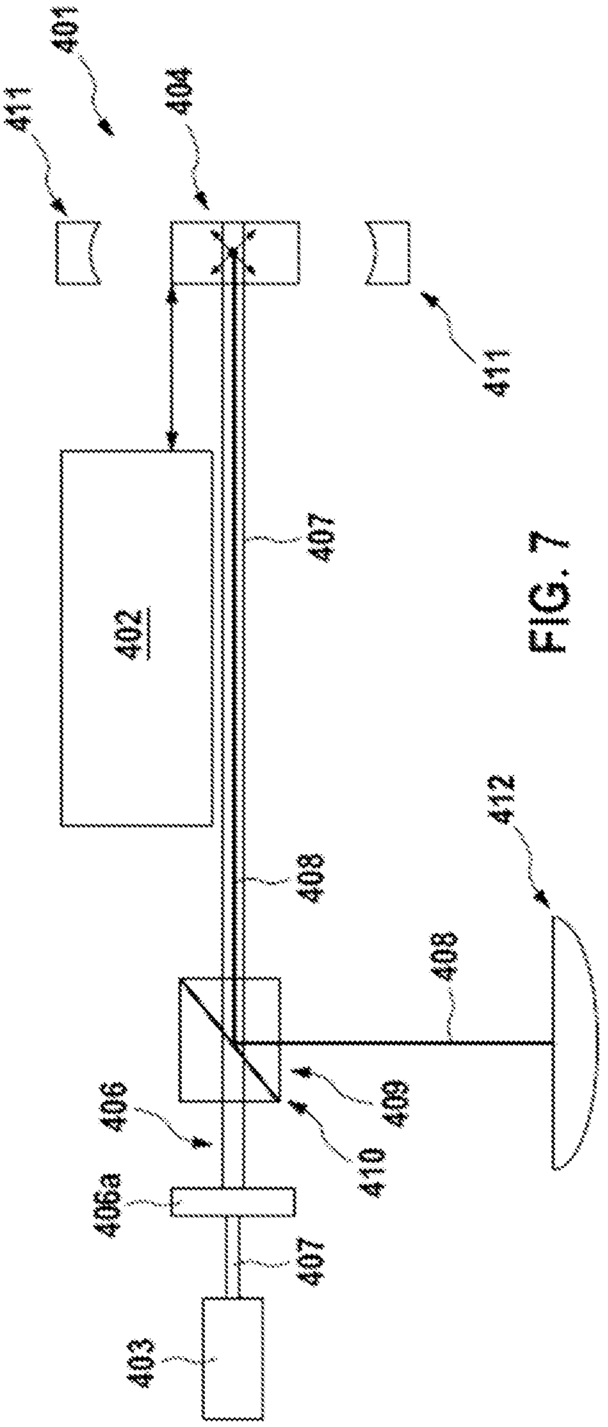
FIG. 7: the construction of the sensor unit of FIG. 6 in greater detail.

FIG. 7 shows in greater detail the sensor unit 400 comprising a first sensor 401 and a second sensor 402 of FIG. 6. Furthermore, in FIG. 7, the light source 403 can be seen, which serves to generate light, in other words, excitation light 407. Via an optical fiber 406, further preferably a fiber coupler 406*a*, the light is supplied to the first sensor (401), namely the diamond 404. The excitation light 407 passes through a lens 409, namely a dichroic mirror 410, which is arranged to allow the excitation light 407 to pass through unhindered.

Furthermore, FIG. 7 shows a source 411 for generating microwaves necessary for a corresponding split of the energy levels of the NV centers. The fluorescence 408 triggered by electron transitions is passed through the same optical fiber 406, however does not pass through the lens 409 but is redirected therefrom such that only fluorescence 408 meets the photodetector 412. In other words, the lens 409 ensures that the emitted fluorescence 408 can strike the photodetector 412 separately from the excitation light 407. The optical fiber 406 used for the first sensor 401 can be used to fasten the second sensor 402.

Figure 8:
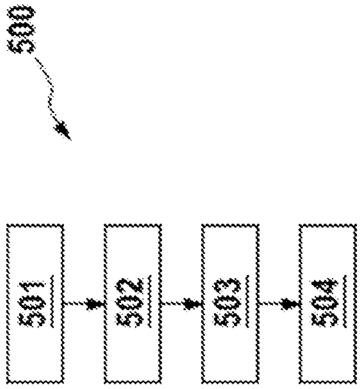
FIG. 8: a method diagram of a method according to the disclosure.

FIG. 8 shows a flowchart of the method 500 according to the disclosure. In a first step, the first sensor 401 is arranged in close proximity to an object 300 to be measured 501. A background magnetic field 502 is measured using the second sensor 402 and the background magnetic field is determined at the location of the first sensor 401, 503. In this way, the measurement signal of the first sensor 401 may be calibrated 504 by subtracting the background magnetic field at the location of the first sensor 401 from the measurement signal of the first sensor 401.

The invention claimed is:

1. A sensor unit for detecting a magnetic field, comprising:

a light source configured to generate excitation light;

at least one first sensor configured to determine a measurement signal of an object to be measured;

a second sensor configured to determine a background magnetic field; and an optical fiber connected to the light source and the at least one first sensor, the optical fiber configured to pass the excitation light from the light source to the at least one first sensor, wherein the at least one first sensor is configured as a diamond-based NV magnetometer and comprises a diamond having at least one negatively charged NV center that has a fluorescent effect, wherein the diamond-based NV center emits fluorescence in response to the excitation light from the light source, wherein the second sensor is a gas vapor cell magnetometer or a superconducting quantum interference device (SQUID) magnetometer, wherein the second sensor is fastened to the optical fiber at a defined distance from the at least one first sensor, and wherein the measurement signal is calibrated or corrected based on the background magnetic field and the defined distance.

2. The sensor unit according to claim 1, wherein the at least one first sensor is configured to be arranged in close proximity to the object to be measured.

3. The sensor unit according to claim 1, further comprising:

an evaluation unit including at least one signal processing unit and a control unit configured to determine a first sensor signal from the at least one first sensor and a second sensor signal from the second sensor.

4. The sensor unit according to claim 1, further comprising:

a photodetector configured to receive the emitted fluorescence.

5. The sensor unit according to claim 4, further comprising:

a lens configured to separate the excitation light and the emitted fluorescence so that only the emitted fluorescence falls on the photodetector.

6. A method for detecting a magnetic field with a sensor unit according to claim 1, the sensor unit comprising the at least one first sensor and the second sensor, the method comprising:

arranging the at least one first sensor in close proximity to the object to be measured;

measuring the background magnetic field using the second sensor;

determining the background magnetic field at a location of the at least one first sensor; and calibrating the measurement signal of the at least one first sensor based on the background magnetic field and the defined distance.

7. The method according to claim 6, further comprising:

maintaining the second sensor the defined distance from the at least one first sensor during the measuring of the background magnetic field using the second sensor.

* * * * *